United States Patent [19]
Cho et al.

[11] Patent Number: 5,369,657
[45] Date of Patent: Nov. 29, 1994

[54] SILICON-BASED MICROLASER BY DOPED THIN FILMS

[75] Inventors: Chih-Chen Cho, Richardson; Walter M. Duncan, Dallas, both of Tex.

[73] Assignee: Texas Instruments Incorporated, Dallas, Tex.

[21] Appl. No.: 945,991

[22] Filed: Sep. 15, 1992

[51] Int. Cl.$^5$ ............................................. H01S 3/14
[52] U.S. Cl. .................................... 372/39; 372/7; 372/69; 372/44; 372/50; 372/68
[58] Field of Search .................... 372/41, 7, 6, 68, 2, 372/39, 44, 45, 50

[56] References Cited

U.S. PATENT DOCUMENTS

| | | | |
|---|---|---|---|
| 3,731,225 | 5/1973 | Wild et al. | 372/6 |
| 4,081,763 | 3/1978 | Vlasenko et al. | |
| 4,782,494 | 11/1988 | Pollack et al. | 372/69 |
| 4,995,043 | 2/1991 | Kuwata et al. | 372/7 |
| 5,038,358 | 8/1991 | Rand | 372/41 |
| 5,107,538 | 4/1992 | Benton et al. | 372/41 |
| 5,117,437 | 5/1992 | Rand | 372/41 |
| 5,301,204 | 4/1994 | Cho et al. | 372/69 |

OTHER PUBLICATIONS

L. E. Bausa, et al., "Effect of Nd3+ Concentration on the Emission Spectra of CaF$_2$: Nd Layers Grown by Molecular-Beam Epitaxy," *Journal of Applied Physics*, vol. 70, No. 8, 15 Oct. 1991, pp. 4485-4489.

C. Lei, et al., "Optical Gain Enhancement in Fabry-Perot Microcavity Lasers," *Journal of Applied Physics*, vol. 71, No. 6, 15 Mar. 1992, pp. 2530-2535.

C. C. Cho, et al., "Photoluminescence from Submicron CaF$_2$: Nd Films Grown Epitaxially on Si(111) and Al(111)/Si(111)," *Applied Physics Letters*, vol. 61, No. 15, 12 Oct. 1992, pp. 1757-1759.

C. C. Cho, et al. "Epitaxial Growth of an Al/CaF$_2$/Al/Si(111) Structure," *Applied Physics Letters*, vol. 61, No. 3, 20 Jul. 1992, pp. 270-272.

*Primary Examiner*—Léon Scott, Jr.
*Attorney, Agent, or Firm*—Michael K. Skrehot; James C. Kesterson; Richard L. Donaldson

[57] ABSTRACT

A silicon-based microlaser formed of rare-earth-doped CaF$_2$ thin films has a semiconductor substrate material (240) and a CaF$_2$ film layers (234) grown on semiconductor substrate material (240), The CaF$_2$ film layer (234) is doped with a predetermined amount of rare-earth-dopant that is sufficient to cause a spectral emission from the CaF$_2$ film layer (234) having a narrow linewidth when the CaF$_2$ film layer (234) is optically or electrically pumped.

26 Claims, 8 Drawing Sheets

SILICON-BASED MICROLASER BY DOPED THIN FILMS

TECHNICAL FIELD OF THE INVENTION

The present invention relates to lasers, and more particularly to a silicon-based microlaser formed from a doped thin glass film capable of producing an intense spectral emission having a narrow linewidth upon being optically or electrically pumped.

BACKGROUND OF THE INVENTION

The availability of all silicon-based optoelectronic integrated circuit (OEIC) technology promises to revolutionize the optoelectronic industry and significantly impact a wide range of both military and commercial applications. One such area of impact is multi-chip module interconnectivity. Silicon-based OEICs will not only solve resistivity and high-capacitance problems by replacing electron transport with photons, they will also provide new functionality, such as circuit-level image processing. Silicon OEICs will also provide cost inroads to commercial markets as high-volume silicon processes enjoy economies of scale unparalleled by other electronic or optoelectronic materials technologies. Furthermore, silicon-based OEICs are expected to provide new functionality such as circuit-level image processing.

There are four technologies required to make silicon-based OEICs a reality: (1) detectors; (2) waveguides; (3) modulators and (4) emitters. While there has been considerable progress in the first three areas, a lack of an appropriate silicon-based light-emitting device, particularly a silicon-based laser, has greatly hindered the development of fully integrated silicon-based OEICs technology.

Most work to date on OEICs has been based on III–V materials. However, post-ultra large-scale integrated (ULSI) work will likely continue to use silicon substrates because of low material costs, high mechanical strength, good thermal conductivity, and the highly developed processing methods available for silicon. One approach to integrating optical and digital electronics is to integrate III–V silicon materials using epitaxially grown III–V layers for selected regions on silicon substrates. Although laser action from III–V layers grown epitaxially on silicon has been demonstrated, progress in this area has been limited by material quality problems resulting from the large lattice and thermal expansion mismatch between the two systems and incompatibilities between III–V and silicon processing.

Reduced cavity size has been found to significantly affect laser characteristics for silicon-based lasers. When the cavity length is comparable to the wavelength of the cavity-defined radiation, cancellation of spontaneous emissions, zero-threshold lasing and enhanced gain may be achieved. The degree of gain enhancement is determined by the coherent length of the spontaneously emitted radiation. Gain enhancement has been predicted to increase more than five-fold in III–V semiconductor microcavities as the emission linewidth decreases from 100 nm to 30 nm.

Although possible applications of these phenomena have been considered mostly for semiconductor lasers, the microcavity effects can also be applied to solid state lasers. Solid state lasers generally provide better thermal stability and narrower emission linewidths than semiconductor lasers. The narrow emission linewidths gain media from solid state lasers are ideal for inducing microcavity gain enhancement effects.

A need also exists for a way, to achieve light emission from these films by electroluminscence rather than by photoluminescence. If this were possible, electrons could be used to produce photons and, thus, utilize the optoelectronic devices made of these films through voltage variation.

SUMMARY OF THE INVENTION

According to one aspect of the present invention there is provided a silicon-based microlaser formed with $Nd^{3+}$ doped a $CaF_2$ thin film. The microlaser includes at a minimum a semiconductor substrate material comprising silicon and a $CaF_2$ film grown on the semiconductor substrate material. The $CaF_2$ film includes a predetermined amount of $Nd^{3+}$ dopant sufficient to cause a strong spectral emission when the $CaF_2$ film is optically pumped.

A technical advantage of the present invention is that it uses rare-earth-doped $CaF_2$ as a gain medium for the silicon-based microlaser. As a result, the present invention possesses significant advantages, including high-intensity emission even for films as thin as 200 nms; narrow emission linewidths (e.g., 0.12 nm at 4.2 at 1 nm at 2980 K), the ability to use established growth processes, and to pattern submicrometer features.

Another technical advantage of the present invention is that the silicon-based microlaser has a very low lasing threshold. This is advantageous because first, if laser action can not be obtained by direct electrical pumping of the gain-medium, the low threshold exhibited by microcavities allows pumping by weak electroluminescent light sources. Additionally, low thresholds are attractive for low-power applications, particularly in future high-density circuits where power generation will be performance limiting.

Another technical advantage of the present invention is that since solid-state lasers are generally less sensitive to temperature changes than semiconductor lasers, the silicon-based microlaser of the present invention will be more stable than semiconductor lasers operating in close proximity to high-power-density circuitry.

Another technical advantage of the present invention is that since $CaF_2$ may be grown on silicon epitaxially, and vice-versa, a solid state laser that uses $CaF_2$ as the host material is compatible with silicon-based technology, Yet another technical advantage of the present invention is due to the property that RE-doped fluorides also exhibit very narrow emission linewidths. In particular, photoluminescence spectra from silicon-based $CaF_2$:Nd microcavity layers formed according to the present invention show high intensity and narrow emission linewidths, even when the thickness of the $CaF_2$:Nd films is reduced to 0.2 microns. Photoluminescence linewidths from the $CaF_2$:Nd films of the 0.12 nm and 1.5 nm have been observed for spectra taken at 4.2 K and 300 K, respectively.

Another technical advantage of the present invention is that the photoluminescence intensities of $CaF_2$:RE films used in the silicon-based laser of the present invention are relative insensitive to the crystalline quality of the films. This is significantly different from semiconductor laser materials, whose photoluminescence intensity is highly dependent on the crystalline quality of the materials. Consequently, semiconductor laser materials are more vulnerable to defects in the materials. The bright and narrow emission lines obtained from submicrometer-thick $CaF_2$:Nd films, plus their low refractive index and insensitivity to crystalline defects, provide an ideal material for achieving a silicon-based microcavity laser.

A technical advantage of the present invention is that it permits the use of several approaches to increase electroluminscence efficiency of rare-earth doped $CaF_2$ thin films. These include (1) semi-conductive $CaF_2$ films grown by sputtering; (2) forming superlattice structures made of $CaF_2$:RE and other semiconductor layers that cause carriers to accelerate in semiconductor lasers and gain enough energy to induce excitation in the $CaF_2$:RE layers; and (3) adding a second RE as an activator together with a primary center (such as Nd and Eu) into $CaF_2$.

An important aspect of the preferred embodiment takes the form of silicon-based microlaser by doped thin glass films. The preferred embodiment employ rare-earth-doped $CaF_2$ thin films. By monolithically integrating optical and electrical components on a single semiconductor chip, optoelectronic integrated circuits (OEIC's) offer great potential to meet future telecommunication and computing system needs. Most of current OEIC's are made of III–V compounds. Silicon-based OEIC's take advantage of the well-established silicon technology and reduce the material cost of OEIC's. However, the development of silicon-based OEIC's has been hindered by the lack of an appropriate silicon-based light emitting device-particularly, a silicon-based laser device. Although GaAs on silicon has been used to make light emitting devices recently, the crystalline quality is still immature for a laser device at this moment.

Since $CaF_2$ can be grown epitaxially on silicon and vice versa, a solid state laser made of $CaF_2$ will be compatible with silicon-based technology. Furthermore, a solid state laser offers narrower emission lines and better thermal stability than a semiconductor laser. Bulk $CaF_2$:Nd and Nd-doped $CaF_2$ thin films grown according to the preferred embodiment on silicon and Al/Si exhibit strong photoluminescence emission lines. These results indicate that these thin films can be used for the fabrication of a silicon-based light emission device and a silicon-based microlaser chip.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The development of microcavity lasers originated from studies of interactions between atoms/molecules and the electromagnetic radiation field. In 1946, Purcell predicted that the spontaneous emission rate of an excited atom would be changed if the atom were put in a cavity with dimensions similar to the radiation wavelength of the atom. Using fluorescent dyes, the phenomenon was demonstrated experimentally by Drexhage in 1974. In 1981, the issue was readdressed by Kleppner, and an increasing number of experimental and theoretical results were reported in the following decade. Recently, increasing interest in the fabrication of surface emitting laser devices, which are inherently composed of high-quality cavities and often radiation wavelengths of similar dimension, has notably escalated the studies of microcavity effects.

For a conventional laser, the efficiency to couple emitted radiation into a mode is on the order of $10^{-4}$ to $10^{-5}$. When the optical modes are reduced to single mode by the formation of a microcavity, the coupling efficiency can be close to unity. Other unique features of a microcavity laser include thresholdless lasing, disappearance of relaxation oscillation, increase in dynamic response speed, and altered emission lifetime. The degree of microcavity effects is dependent on the emission linewidth of the gain medium, mirror reflectivity, difference in refractive indices between the gain medium material and the mirror materials, position and thickness of the gain medium, and the three dimensions of the cavity.

Figure 1:
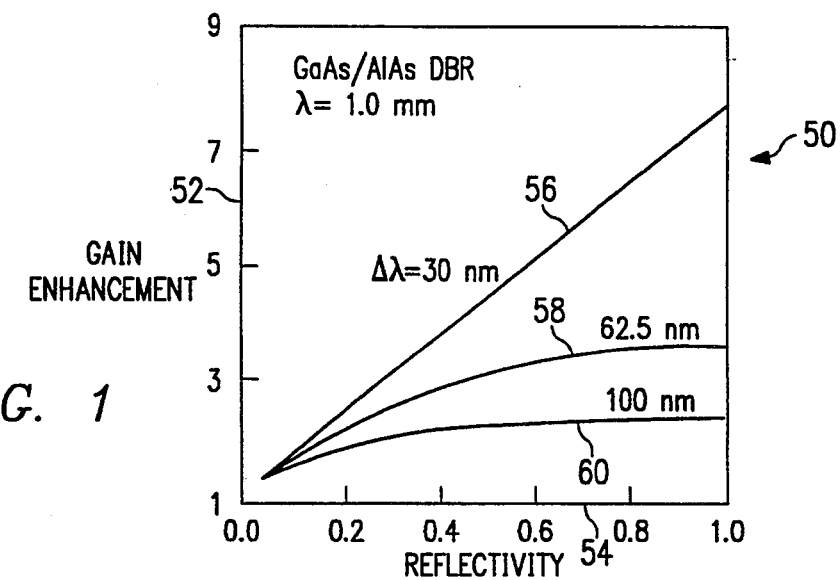
FIG. 1 shows the gain enhancement of a microcavity with several emission linewidths ranging from 30 nm to 100 nm which are typical for III–V semiconductor.

Microcavity effects have been calculated to increase as emission linewidth decreases. FIG. 1 shows the gain enhancement of a microcavity with several emission linewidths ranging from 30 nm to 100 nm, which are typical for Group III–V semiconductors. In particular, graph 50 of FIG. 1 shows along ordinate 52 a measure of gain enhancement versus reflectivity as plotted along abscissa 54. Exemplary linewidths are shown as line 56 for a 30 nm linewidth, line 58 for a 62.5 nm linewidth, and line 60 for a 100 nm linewidth. The gain enhancement for an emission with a 100-nm linewidth saturates at 2.4 when reflectivity is near unity. In contrast, the gain enhancement is 7.6 when the emission linewidth is 30 nm.

Microcavity effects are also strongly dependent on the quality of the cavity mirrors- FIG. 1 also shows that high-reflectivity mirrors provide high gain enhancement, especially when the emission linewidth is small. When a mirror is made of quarter-wavelength multi-layer dielectric film (i.e., a distributed Bragg reflector (DBR)), the quantum efficiency increases as the difference in refractive index between the alternative films increases. In addition to the difference in refractive index, other factors such as control of film stoichiometry, interface sharpness, and film stress may also affect the performance of the mirrors.

The large difference in refractive index between $CaF_2$ and other semiconductors has prompted efforts to use $CaF_2$ as the material for high-quality Bragg reflectors. For example, using Bragg reflectors made of $CaF_2$ and ZnSe, a microcavity III–V semiconductor laser can be formed to exhibit laser performance that is superior in terms of threshold current and lasing efficiency to a laser using $Si/SiO_2$ mirrors.

Enhancement or prohibition of spontaneous emission in a microcavity can be achieved by controlling the length of a microcavity and the position of the active gain medium in the cavity. Enhanced emission occurs when the cavity length is tuned to the emission wavelength and the active gain medium is positioned at the antinode position. In this configuration, the field will interact with the gain medium- Reduced emission will be observed when the gain medium is located at a node position.

Theoretical analysis of a three-dimensional tetragonal microcavity confined normal to the surface by DBRs and transversely by cleaved planes suggests that with an emission linewidth at 1.5 nm the efficiency for coupling total radiation energy into a resonant mode (spontaneous emission factor) increases more than an order of magnitude when the transverse dimensions are reduced from 15 to 2 times the radiation wavelength. Similar enhancement in coupling efficiency has also been suggested for a cylindrical microcavity structure.

For the preferred embodiment, Al and $CaF_2$ films were grown on 4-inch diameter silicon wafers in an ultra-high vacuum system (VG Semicon V80) composed of a molecular beam epitaxy (MBE) chamber, a metallization chamber and a chemical vapor deposition chamber. Wafers can be transferred between these three chambers through a ultra-high vacuum transfer system, which is annexed with two loading locks. Base pressure of the MBE chamber and the metallization chamber were below $1 \times 10^{-10}$ mbar and $1 \times 10^{-9}$ mbar, respectively. The chamber pressure during $CaF_2$ growth was $5 \times 10^{-10}$ mbar and the process pressure during Al growth was $2 \times 10^{-9}$ mbar. $CaF_2$ and $NdF_3$ are evaporated thermally from effusion cells. The deposition rates of these fluorides are determined by controlling the cell temperatures and monitoring the pressure of the fluxes. The deposition rates increase proportionally as the flux pressures increase. The compositions of the films are determined by an X-ray fluorescence method. The thickness of the films are decided by step profile-measurements. $CaF_2$:Nd films are grown on Si(111) and Al(111)/Si(111) substrates with substrate temperatures from 100° C. to 700° C. According to the results from photoluminescence (PL) spectra, the optimal growth temperature for $CaF_2$:Nd growth is 500° C. on silicon and 100°–300° C. on Al.

Characterization of the optical properties of the films by photoluminescence (PL) show strong PL emission at $\sim 0.9$ μm, $\sim 1.3$ μm, and $\sim 1.1$ μm, including the 1,046-μm laser emission line observed for bulk $CaF_2$:Nd. As the thickness of the films decreases from 1 μm to 0.2 μm, the intensity decreases proportionally, and the emission wavelengths and the relative band intensities of the PL spectra from the $CaF_2$:Nd films grown on Al/Si remain unchanged. This result suggests that the luminescence properties of the films are not distorted, even though the 0.2-μm film is close to the $CaF_2$/Al interface where more defects tend to exist.

It is important to note that transition elements, instead of rare-earth elements may be used as dopants for the purposes of the present invention. Additionally, PL intensities of $CaF_2$:Nd films do not depend on the crystalline quality of the films. This is very different from semiconductor light-emitting materials, whose PL intensities are highly dependent on the crystalline quality of the materials. Consequently, they are more vulnerable to defects in the materials.

Figure 2:
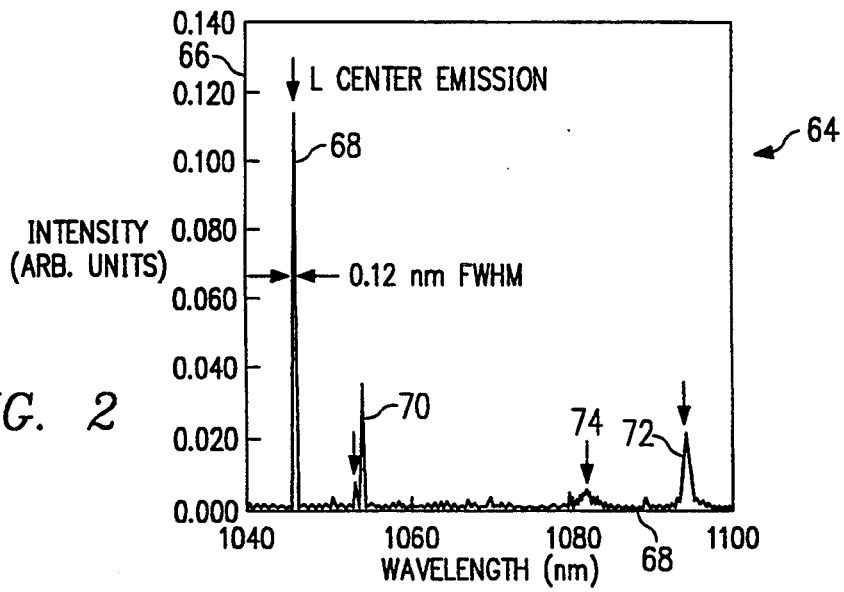
FIGS. 2 and 3 show the helium temperature photoluminescence spectrum of a 1.0 micron thick $CaF_2$:Nd film grown a Al(111)/Si(111) substrate.
Figure 3:
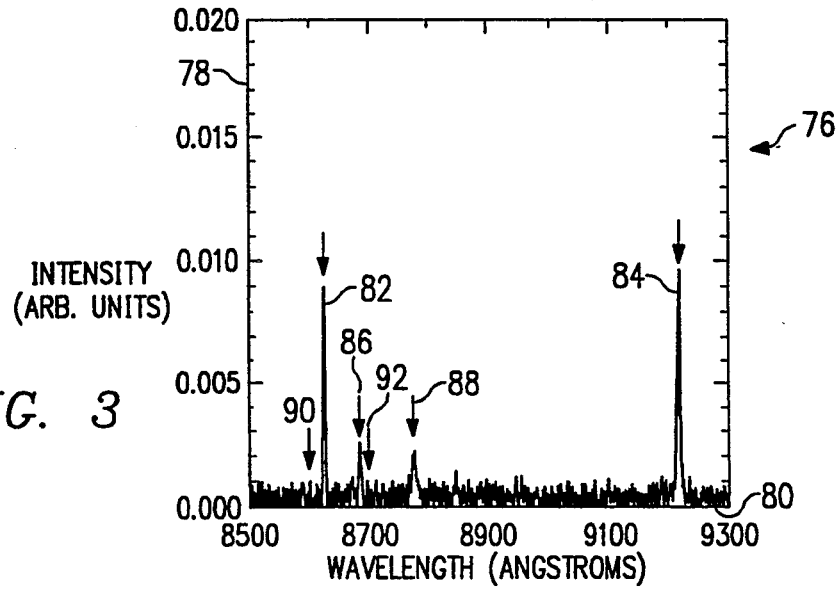

FIGS. 2 and 3 show the helium temperature PL spectrum of a 1.0-μm thick $CaF_2$:Nd (0.48 wt %) film grown on a Al(111)/Si(111) substrate. In FIG. 2, chart 64 has a possible intensity measurement range of 0.000 through 0.140 as arbitrary units along ordinate 66 and wavelength measurements ranging from 1040 nm through 1100 nm along abscissa 68. L center emission as indicated by luminescence spike 68 has a linewidth of 0.12 nm. Other luminescence peaks include peak 70, 72 and 74. The transitions shown in FIG. 2 are from $^4F_{3/2} \rightarrow ^4I_{11/2}$ states.

Chart 76 of FIG. 3 includes a possible intensity measurement range from 0.000 through 0.020 in arbitrary units along ordinate 78 plotted against the wavelength range from 8500 to 9300 Å along abscissa 80. Luminescence peaks include approximately equivalent intensity peaks 82 and 84, smaller luminescence peaks 86 and 88, and yet smaller intensity peaks 90 and 92. The peaks in FIG. 3 result from $^4F_{3/2} \rightarrow ^4I_{9/2}$ transitions. The emission wavelengths observed from L centers in bulk $CaF_2$:Nd are marked with arrows. Spectra from a 10 μm thick 0.3 wt. % $CaF_2$ film on a $CaF_2$ substrate, show similar wavelengths and relative intensities to those in FIG. 3.

The similarities of PL spectra for $CaF_2$:Nd grown by different methods and on different substrates suggest that, at low Nd concentrations, emission from L centers dominate. In contrast, as the Nd concentration increases, more significant differences in PL spectra are observed.

Figure 4:
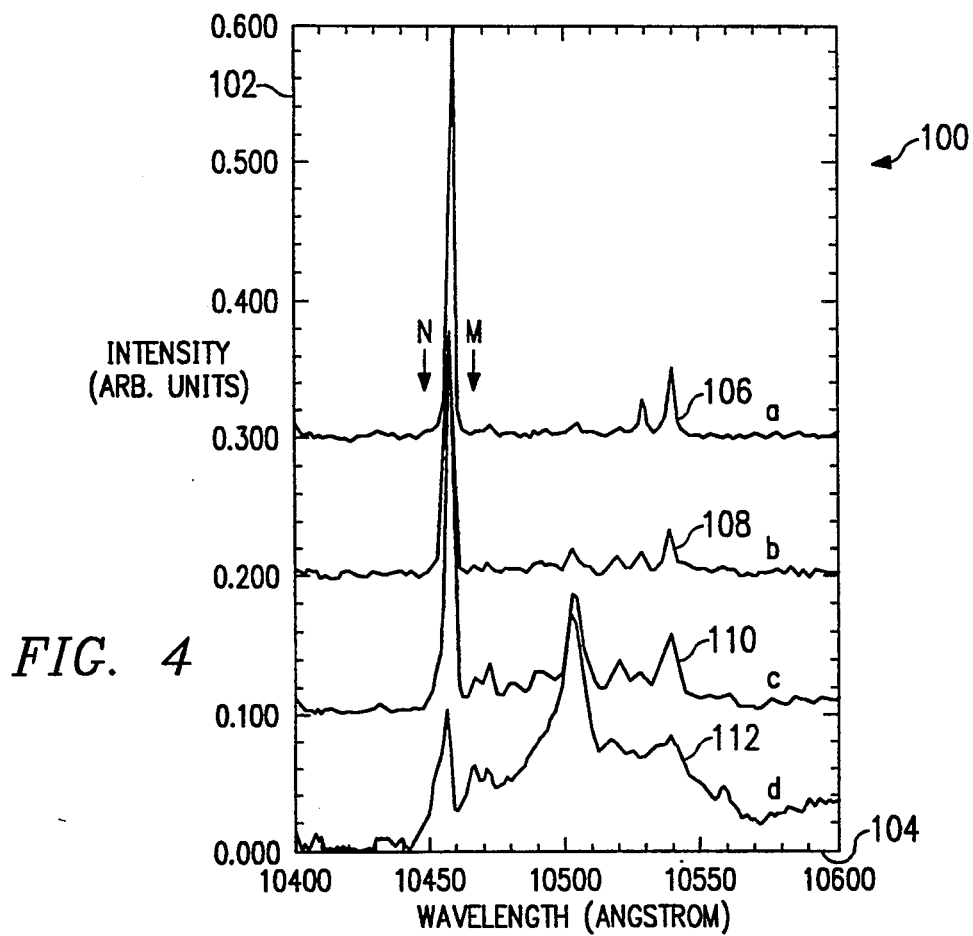
FIG. 4 shows concentration dependence on the luminescence from a one micron-thick $CaF_2$:Nd film grown on Al/Si(111)

FIG. 4 shows concentration dependence of the luminescence from 1-μm-thick $CaF_2$:Nd films grown on Al/Si(111). Chart 100 of FIG. 4 illustrates intensity in arbitrary units ranging from 0.000 through 0.600 along ordinate 102 plotted against wavelengths in Angstroms ranging from 10400 through 10600 Å along abscissa 104. In particular, plot 106 records luminescence intensity for a 1-μm-thick $CaF_2$:Nd film with 0.48% Nd formed on a MBE-grown layer of Al/Si (111). Plot 108 plots luminescence intensity for the same thickness of $CaF_2$:Nd film with 0.96% Nd on Al/Si(111). Plot 110 shows luminescence for the same thickness of $CaF_2$:Nd film with 1.9% Nd on Al/Si(111). Plot 112 shows luminescence intensity for the same CaF$_2$:Nd film thickness with 3.8% Nd on Al/Si (111). The 10457 Å line, which is usually used for laser operation completely disappears in bulk material when the Nd concentration is above 3.8 wt. %.

The most important difference between the current films and previously reported bulk CaF$_2$:Nd and CaF$_2$:Nd/CaF$_2$ is the reduced intensity of emission lines from M and N defect centers in the current films even when the Nd concentration is as high as 3.8 wt. %. For bulk CaF$_2$:Nd with 3.8 wt. % Nd, the emission intensity from M and N centers are about the same as that from L centers. For CaF$_2$:Nd/CaF$_2$ with at least 3.7 wt. % Nd, the intensity of the luminescence at N centers is 80% the intensity at L centers. In contrast, FIG. 4 shows that no emission at the N center wavelength (10448 Å) is detected in any of the CaF$_2$:Nd on Al/Si samples. As the Nd concentration increases, a small peak appears corresponding to the M center (10467 Å) but the intensity is still only 50% of the intensity of the L center at a 3.8 wt. % Nd concentration.

These comparisons indicate that for the current CaF$_2$:Nd grown at low temperatures by MBE the orthorhombic N and M centers formed by aggregated Nd$^{3+}$-F$^-$ can be reduced. The low substrate temperature used to grow CaF$_2$:Nd/Al/Si may be the reason why low M and N defect CaF$_2$:Nd can be prepared. Low growth temperature may prevent fluorine loss and, thus, avoid the charge compensation mechanism in bulk CaF$_2$:Nd. Besides, the distribution of Nd-F and its aggregates can be altered by the low-temperature process, because the kinetic energy of the atoms is too low for the atoms to diffuse and reach an equilibrium state as occurs at temperatures above 600° C.

Figure 5:
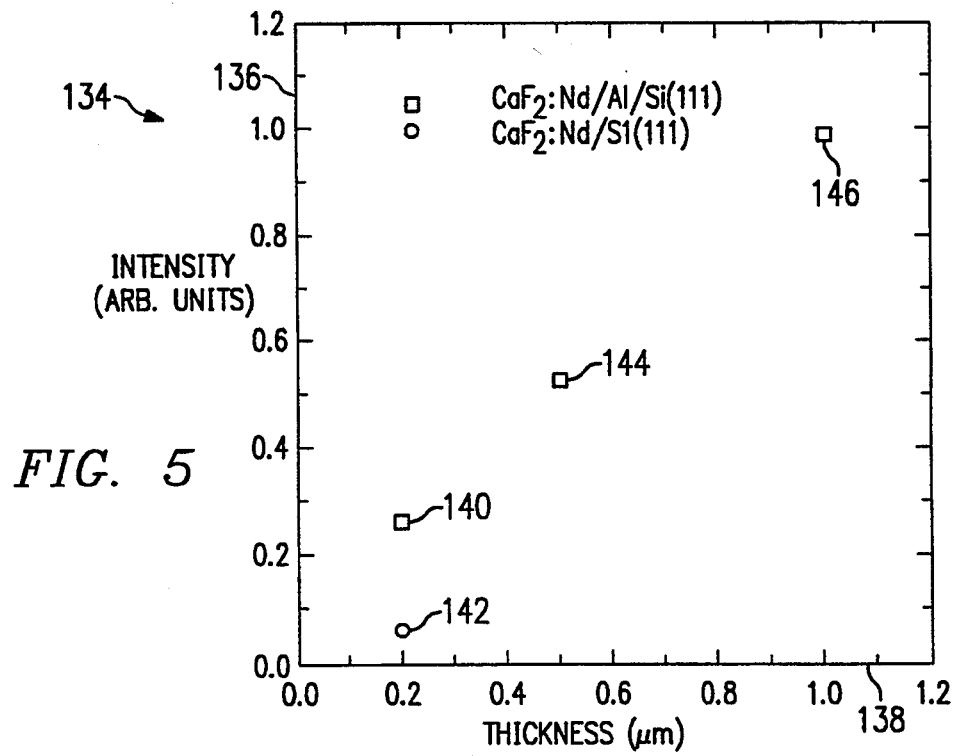
FIG. 5 shows the relative intensity of the 10457 Å line for $CaF_2$:Nd films grown on Al/Si(111) with various thicknesses.

FIG. 5 shows the relative intensity of the 10457 Å line for CaF$_2$:Nd (1.9 wt. %) films grown on Al/Si(111) with various thickness and a 0.2 μm CaF$_2$:Nd (1.9 wt. %) film grown on Si(111). The plot 134 of FIG. 5 records along abscissa 136 intensity in arbitrary units potentially ranging from 0.0 through 1.2 with CaF$_2$:Nd film thickness measurements ranging from 0.0 through 1.2 μm. Thus, with a thickness of 0.2 μm, the relative intensity for an CaF$_2$:Nd film on Al/Si(111) substrate is recorded as point 140. For a Si(111) substrate relative intensity is recorded at point 142 for a 0.2-μm CaF$_2$:Nd film thickness. Other film thicknesses and relative intensities for two CaF$_2$:Nd film thickness include a 0.5-μm film thickness at point 144 and 1.0-μm thickness at point 146.

The PL intensity decreases proportionally as the thickness of the films reduces from 1.0 μm to 0.2 μm. Furthermore, the emission wavelengths and the relative PL intensity of the films are identical regardless of their thickness. These results suggest that luminescence properties are not distorted even when the film is only 0.2 μm, although the 0.2-μm-thick film is close to the CaF$_2$/Al interface and tends to be more vulnerable to interfacial defects. For films of the same thickness, but different substrates, the PL intensity of the CaF$_2$:Nd on Al is higher than that of the CaF$_2$:Nd on Si. The higher PL intensity from CaF$_2$:Nd on Al/Si(111) may be because over 90% of the 514.5 nm incident light is reflected into the CaF$_2$:Nd film from the Al layer, while the light is mostly absorbed in the Si substrate of CaF$_2$:Nd/Si(111).

Figure 6:
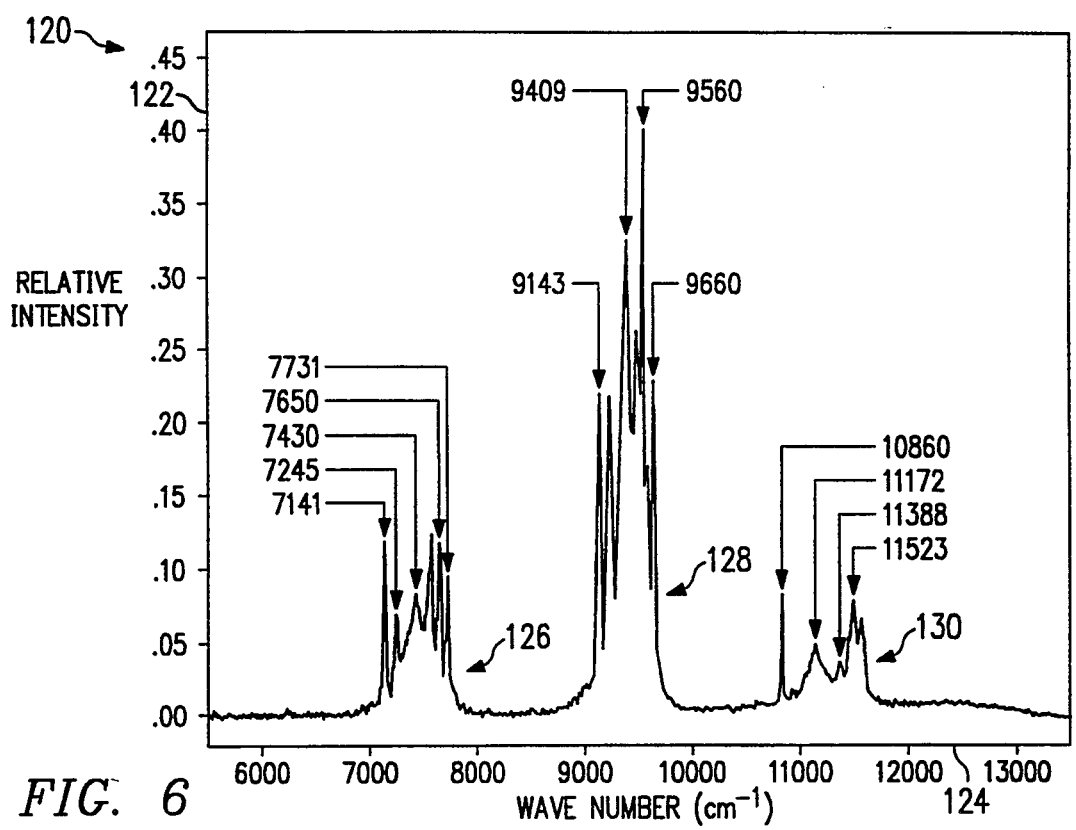
FIGS. 6 and 7 show the room-temperature photoluminescence spectra of a 0.2 micron thick $CaF_2$:Nd film (1%) and a 4.0 micron thick GaAs film.
Figure 7:
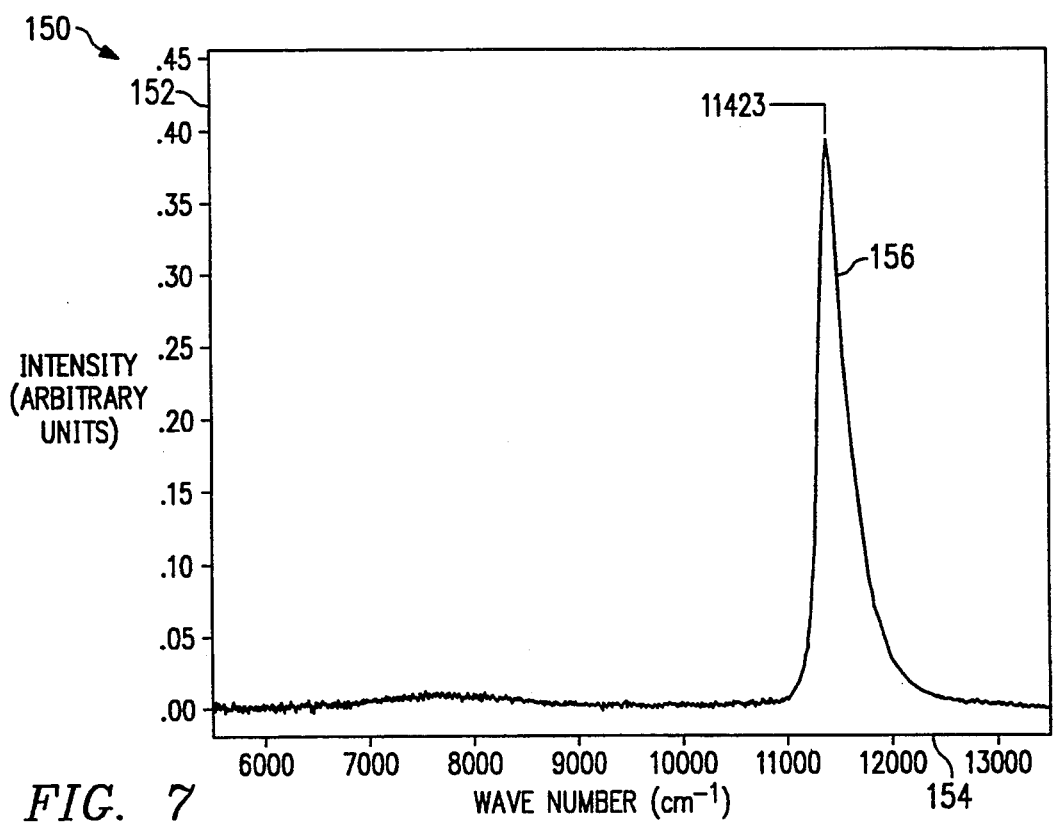

FIGS. 6 and 7 show the room-temperature PL spectra of a 0.2-μm-thick CaF$_2$:Nd (1%) film and a 4.0-μm-thick GaAs film, respectively. In particular, plot 120 of FIG. 6 records along ordinate 122 relative intensity within a range from 0.00 through 0.45 in arbitrary units along a wavelengths range from 6,000 through over 13,000 cm$^{-1}$ along abscissa 124. PL intensity peaks occur in regions 126, 128 and 130. Within regions 126, 128, and 130, local specific frequencies associated with the identified intensity peaks are identified by associated wavelengths in plot 120 of FIG. 6.

In FIG. 7, plot 150 shows a range for relative intensity of from 0.000 through 0.450 along ordinate 152 with wavelengths in Angstroms ranging from less than 6,000 to greater than 13,000 cm$^{-1}$ along abscissa 154. Within this range, peak 156 shows a relative intensity of approximately 0.40 at a L center of 11,423 cm$^{-1}$. The CaF$_2$ film is grown on a Al(111)/Si(111) substrate. The GaAs film is grown on a Si(100) substrate. It is clearly shown that the linewidth of the CaF$_2$:Nd laser emission line (9560 cm$^{-1}$) is narrower than the linewidth of the 11423 cm$^{-1}$ GaAs peak.

The intensity of the CaF$_2$:Nd emission line in FIG. 6 is as strong as the intensity of the GaAs peak in FIG. 7, even though the CaF$_2$ thickness is only one-twentieth of the GaAs thickness. This indicates that CaF$_2$:Nd films can be a good gain medium for laser emission. The crystalline quality of the films are characterized by X-ray diffraction and exhibit a full-width-half-maximum of 130 arcseconds from the GaAs film. In contrast to GaAs, whose PL intensity strongly depends on the crystalline quality of the material, the PL intensity of CaF$_2$:Nd does not show detectable dependence on the crystalline quality of the film. Similar room temperature PL spectra from polycrystalline and single crystal CaF$_2$:Nd films of the same thickness and Nd concentration have been observed.

Comparison of these CaF$_2$:Nd samples with the high quality GaAs film grown on Si(100) (X-ray rocking curve halfwidth of GaAs=130 arcsec) shows that the PL-intensity from a 0.2-μm CaF$_2$:Nd(0.38 wt %)/AlSi thin film is as high as that of the 4-μm-thick GaAs/Si sample, while incident light intensity is identical. The linewidths from the CaF$_2$:Nd films are 1.2 Å and 15 Å when the spectra are taken at 4.2 K and 300 K, respectively. In comparison, the PL linewidths from the GaAs/Si sample are 40 Å and 220 Å at 4.2 K and 300 K, respectively. The narrow emission linewidth of the CaF$_2$:Nd films and the small refractive index of CaF$_2$ are attractive characteristics of a microcavity laser using the concepts of the present invention. Good optical gain may be achieved because of the narrow linewidth. Also, high reflectivity mirrors can be fabricated by taking advantage of the large difference in refractive index between CaF$_2$ and semiconductors.

In summary, thin CaF$_2$:Nd films grown epitaxially on Al/Si(111) according to the preferred embodiment exhibit strong photoluminescence emission even when the film thickness is reduced to 0.2 μm. Suppressed luminescence from M and N centers can be obtained from the low-temperature-grown CaF$_2$:Nd films. The emission line at 10457 Å, which was used for laser operation from bulk CaF$_2$:Nd, shows very narrow linewidth and does not quench until the Nd concentration exceeds 3.8 wt. %. These features makes that CaF$_2$:Nd thin films an attractive gain medium for a microcavity laser fabricated on Si-based substrates.

Yet another aspect of the preferred embodiment is the formation of CaF$_2$:Nd microcavity devices. High-intensity PL obtained from polycrystalline CaF$_2$:Nd forms the basis of microcavity structures composed of polycrystalline CaF$_2$:Nd films sandwiched by two DBRs (distributed Bragg reflectors) to illustrate the invention concepts of the preferred embodiments. The DBRs for these configuration are made of ten pairs of $Ta_2O_5$/$SiO_2$ multilayers. Four-inch silicon wafers were used as the substrates.

Figure 8:
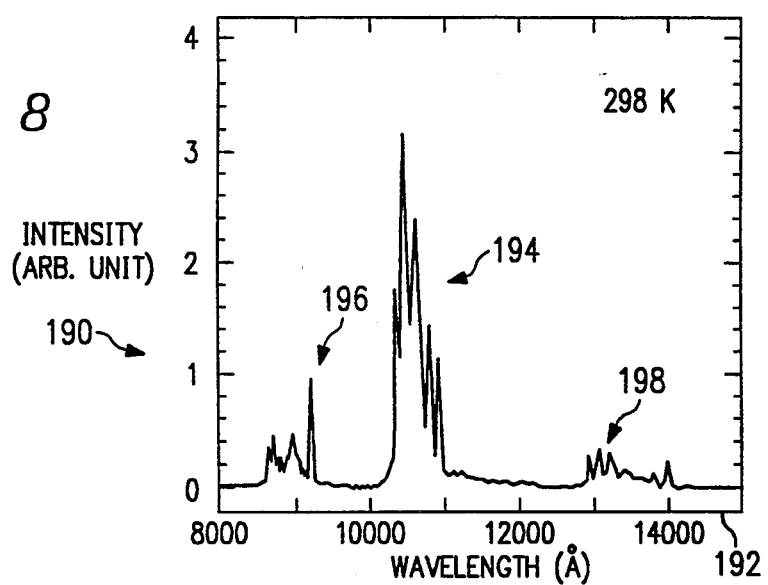
FIG. 8 shows photoluminescence spectra from $CaF_2$:Nd on a $Ta_2O_5/SiO_2$ distributed Bragg reflector.
Figure 10:
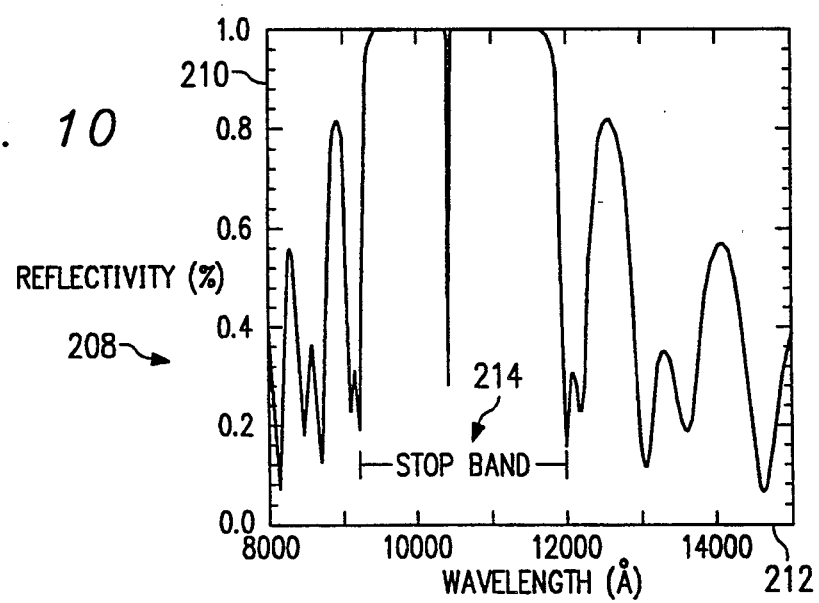
FIG. 10 illustrates the calculated reflectivity spectrum from a half-wavelength $CaF_2$:Nd//($Ta_2O_5/SiO_2$) microcavity using a one-dimensional model.

Shown in FIG. 8 is a room-temperature PL spectrum taken from a $CaF_2$:Nd film grown on a DBR. For FIG. 10, plot 190 records intensity in arbitrary units ranging from 0 through 4 along ordinate 191 against wavelengths in Å ranging from 8000 to approximately 15000 Å along abscissa 192. Peak regions of interest include peak region 194 and minor peak regions 196 and 198. No mirror was fabricated on the top of the $CaF_2$:Nd film. The spectrum shows very similar emission wavelengths and relative intensities to those observed from $CaF_2$:Nd films on Si(111) and Al(111)/Si(111).

Figure 9:
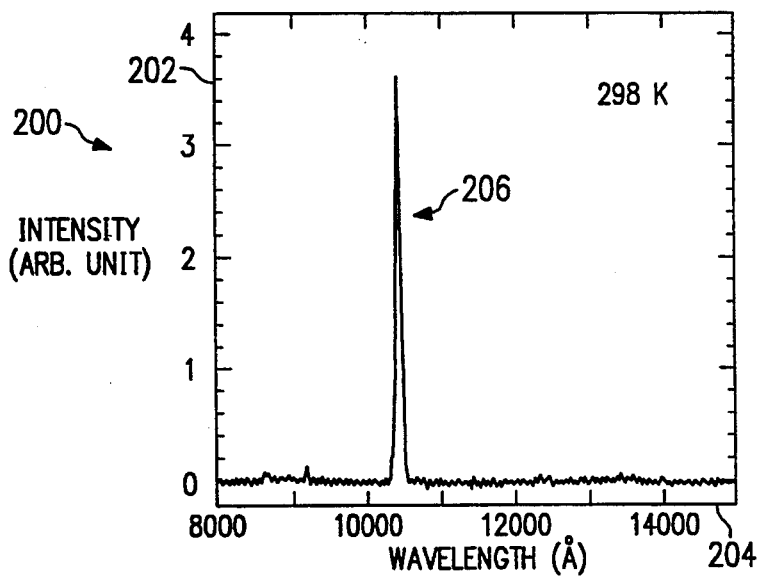
FIG. 9 shows the photoluminescence spectra from a half-wavelength $CaF_2$:Nd//($Ta_2O_5/SiO_2$) microcavity at room temperature.

FIG. 9 shows a room-temperature PL spectrum of a microcavity structure made of $CaF_2$:Nd and $Ta_2O_5$/$SiO_2$ multilayers. Plot 200 of FIG. 9 records intensity ranging from 0 to 4 in arbitrary units along ordinate 202 versus wavelength in Å ranging from 8000 to approximately 15000 Å along abscissa 204. Within plot 200, peak 206 shows the room-temperature PL spectra that the microcavity structure yields. The structure is the same as the sample used for FIG. 14, except that a top DBR mirror has been added to the structure, to form a one-wavelength $CaF_2$:Nd//$(Ta_2O_5/Si)_2$ cavity.

Comparing FIGS. 8 and 9, strong emission lines at 10453 Å and 10472 Å are detected in FIG. 9, while other emission lines around 10500 Å completely disappear. Furthermore, the intensities of the emission lines around 9000 Å and 13000 Å are observed to become much smaller in respect to the 10460 Å transition. These results indicate that the radiation rate at 10453 Å and 10472.1 Å are enhanced by the microcavity and the transitions around 9000 Å and 13000 Å are quenched. Intensity enhancement and linewidth reduction also observed for PL measurements at 770 K.

Shown in FIG. 10 is the calculated reflectivity spectrum for the one-wavelength $CaF_2$:Nd//$(Ta_2O_5/SiO_2)$ microcavity structure. The structure is designed to form a resonant mode at 10460 Å. FIG. 10 shows that while the emission lines around 1050 nm ($^4F_{3/2} \rightarrow ^4I_{11/2}$ transition) are in the "stopband," the transitions around 900 nm ($^4F_{3/2} \rightarrow ^4I_{9/2}$ transition) and 1300 nm ($^4F_{3/2} \rightarrow ^4I_{13/2}$ transition) are in the "passband" of the mirror structure. Consequently, the emission lines around 9000 Å and 13000 Å will not be affected directly by the reflectors and can be used as references when their intensities are compared with those around 1050 Å.

The preferred embodiment also exploits the optical properties of other RE-doped $CaF_2$ to use the effects of different emission wavelengths in a microcavity. Rare-earth ions that luminesce in the visible region are a particularly significant feature of the preferred embodiment. Although it is difficult to predict whether stimulated emissions can be obtained for given dopant transitions, the studies for rare-earth-doped bulk $CaF_2$ and other bulk crystals with similar crystal field environments indicate a wide selection of other laser center dopants applicable to the concepts of the present invention. Electroluminescence and photoluminescence from $CaF_2$ thin films doped with Eu have emission wavelengths centered in the blue at 420 nm, indicating that Eu-doped $CaF_2$ can be a good gain medium. Intense electroluminescence in the ultraviolet region with wavelengths as short as 306 nm have been observed in $GdF_3$ doped $ZnF_2$ films. In addition to the Nd-doped $CaF_2$ thin films on silicon and Al/Si, Dy-doped bulk crystals may be used with the preferred embodiment. Dy-doped material exhibits photoluminescence emission features in the blue-green (around 486 nm), yellow (575 nm), red (665 nm) and near-infrared region of the spectrum (7540 Å and 8390 Å). Ho and Dy are good doping candidates, respectively, for green and yellow emitters.

Instead of single crystal silicon, light emission from "porous Si" has been achieved by both electrical and optical pumping. Integrating porous silicon with Nd-doped $CaF_2$ provides a silicon-based material ("porous Si") with wide emission bandwidth as the light source and a silicon-based gain medium ($CaF_2$:Nd) with narrow emission bandwidth for lasing. The emission wavelengths of porous silicon are between 5200 Å and 9000 Å. These wavelengths are ideal for pumping $CaF_2$:Nd thin films.

Although porous silicon has been formed heretofore electrochemically, analytical studies of porous silicon show that this material is a mixture of amorphous silicon, crystalline silicon, silicon oxides and silicon hydrides The term "porous Si", thus refers to the silicon material that is able to emit visible light. These emissions can be achieved not only by anodizing crystalline silicon, but potentially by conventional growth techniques such as chemical vapor deposition (CVD) and molecular beam epitaxy (MBE).

Figure 11:
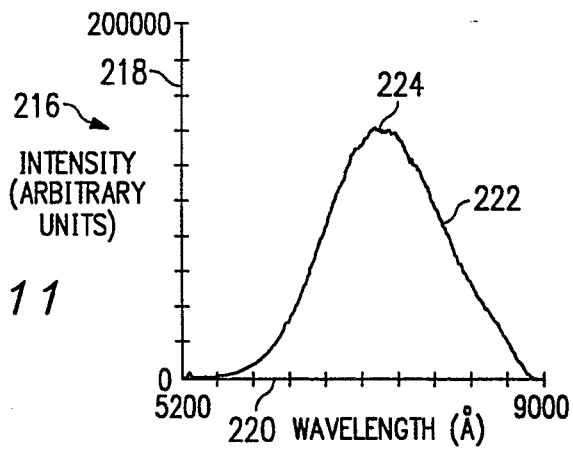
FIG. 11 shows a typical photoluminescence spectrum of porous silicon.

FIG. 11 shows a typical photoluminescence spectrum of porous silicon. Plot 216 of FIG. 14 records along ordinate 218 intensity in arbitrary units ranging from 0 to 200,000 and along abscissa 220 wavelengths ranging from 5,200 to 9,000 Å. Curve 220 shows the luminescence range for porous silicon with a peak 224 between approximately 7,250 and 7,400 Å. The luminescence of the preferred embodiment ranged from 5200 Å to 9000 Å with a maximum intensity at around 7000 Å. Since the absorption spectrum of $CaF_2$:Nd shows strong peaks at 7250–7450 Å, 7800–8000 Å and 8500–8700 Å, the photons emitted from porous silicon that can be effectively absorbed by $CaF_2$:Nd. This results in high-intensity photoluminescence from $CaF_2$:Nd.

Figure 13:
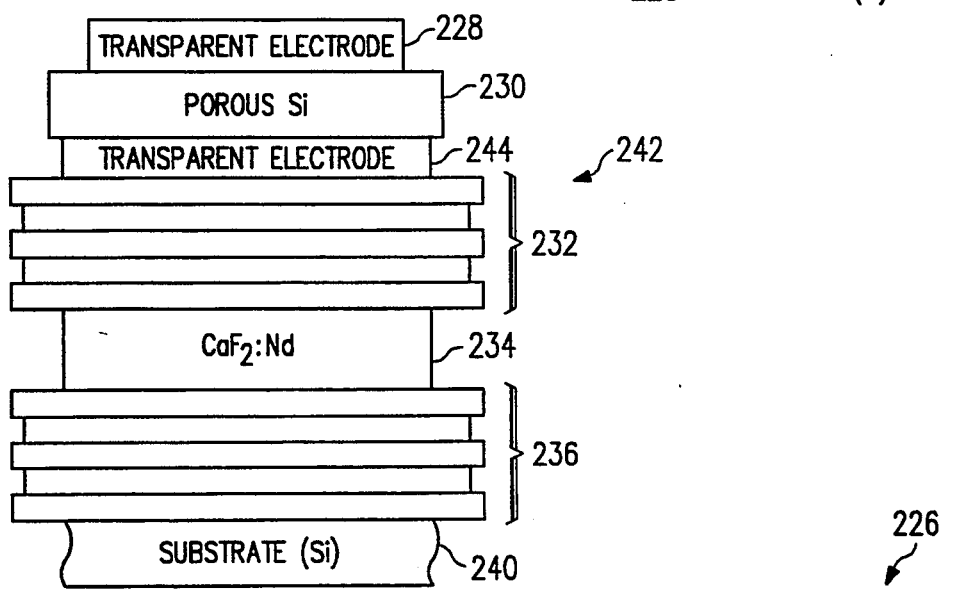
FIGS. 12 and 13 show two embodiments of the present invention that integrate porous silicon with $CaF_2$:Nd so that porous silicon can be used as the light source to pump a $CaF_2$:Nd gain medium.
Figure 12:
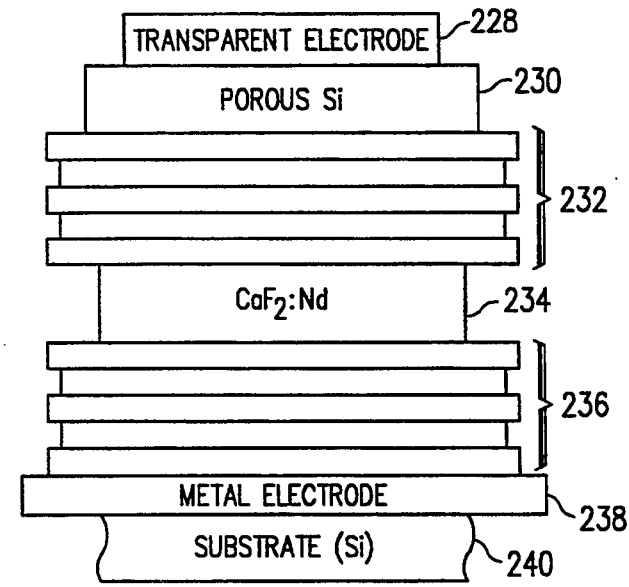

FIGS. 12 and 13 show two structures that integrate porous silicon with $CaF_2$:Nd. Structure 226 of FIG. 12 includes transparent electrode 228 attached to porous silicon layer 230 that is formed upon the first set of Bragg reflectors 232. Next, $CaF_2$:Nd layer 234 is sandwiched between Bragg reflector set 232 and Bragg reflector set 236. Bragg reflector set 236 is mounted to metal electrode 238 which has substrate 240 as its base. In these configurations, porous silicon can be used as the light source to pump $CaF_2$:Nd. While only five layers of dielectrics are shown for each Bragg reflector, the number of layers may be more than 10 pairs for vertical surface emitting laser device so that high reflectivity can be achieved. For edge emitting laser device, the requirement for high reflectivity is not as demanding as vertical surface emitting laser. A metal layer or a Bragg reflector of small number of pairs will be sufficient.

FIG. 13 shows another structure for porous Si as the light emitting source beginning with transparent electrode 228 over porous Si layer 230 which covers another transparent electrode 244. Attached to transparent electrode 244 is a first Bragg reflector set 232 which attaches to $CaF_2$:Nd layer 234. $CaF_2$:Nd layer 234 on its lower side attaches to Bragg reflector set 236. In the configuration of FIG. 16, Bragg reflector set 236 directly attaches to substrate 240. In FIG. 13 both porous silicon and CaF$_2$:Nd are sandwiched between the two electrodes. This structure allows the CaF$_2$:Nd layer to emit light by electroluminescence in certain cases. The CaF$_2$:Nd layer will also be optically pumped by the electroluminescence from porous Si. The drawback of the configuration in FIG. 16 is that the electric field gradient in the porous Si is not as strong as that in the porous Si in FIG. 15. In FIG. 16, the CaF$_2$:Nd layer is optically pumped by the electroluminescence from porous Si. No electric field variation takes place in CaF$_2$:Nd in this configuration.

Figure 14:
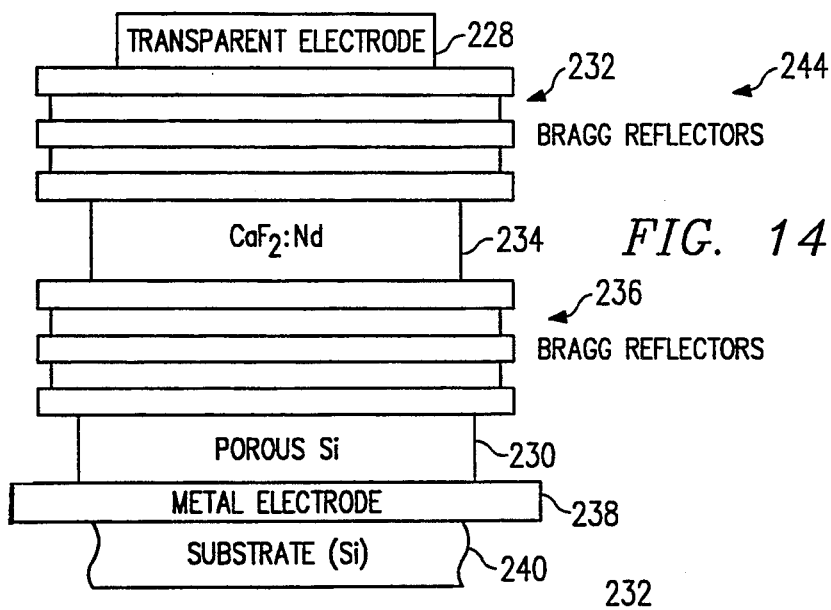
FIGS. 14 and 15 show two alternative embodiments of the present invention that are similar to the embodiments of FIGS. 15 and 16.
Figure 15:
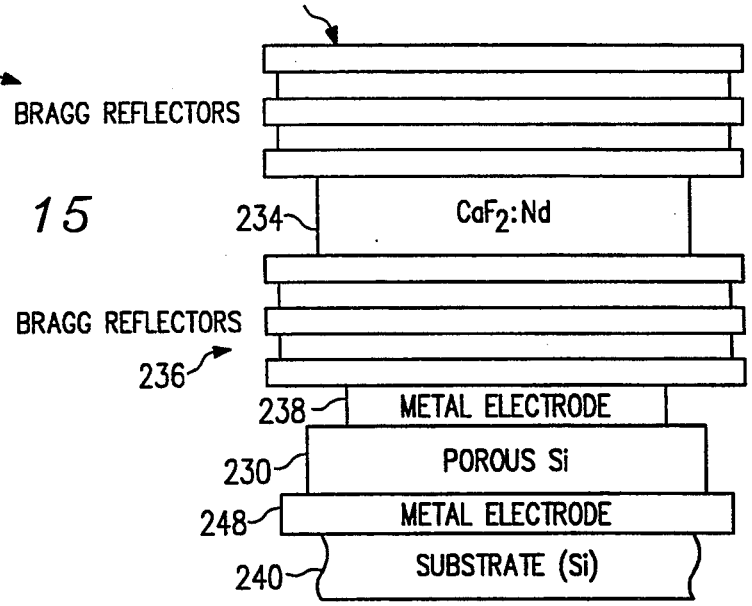
Figure 16:
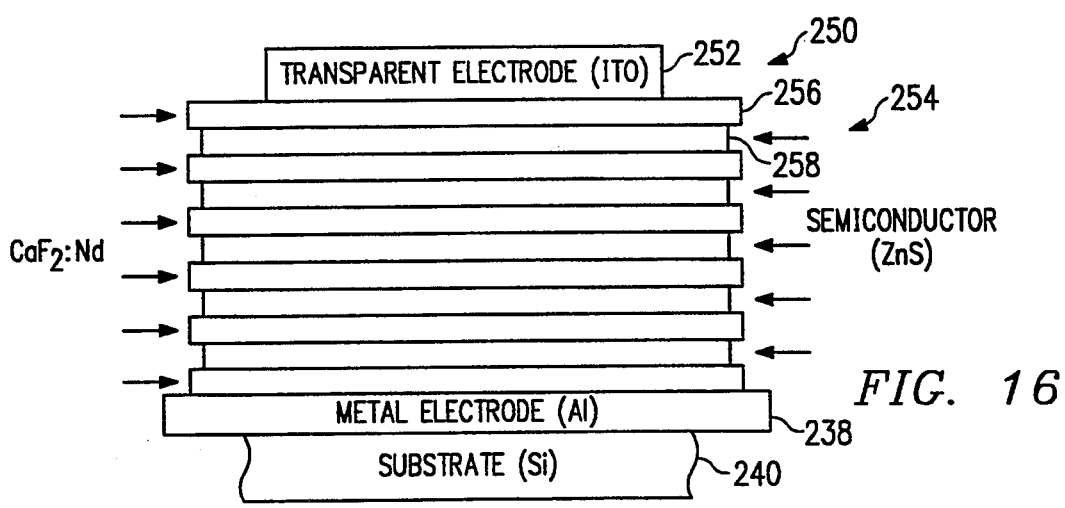
FIG. 16 shows a superlattice structure that can be used to obtain effective electroluminescence from a $CaF_2$:ZnS multilayer structure.
Figure 17:
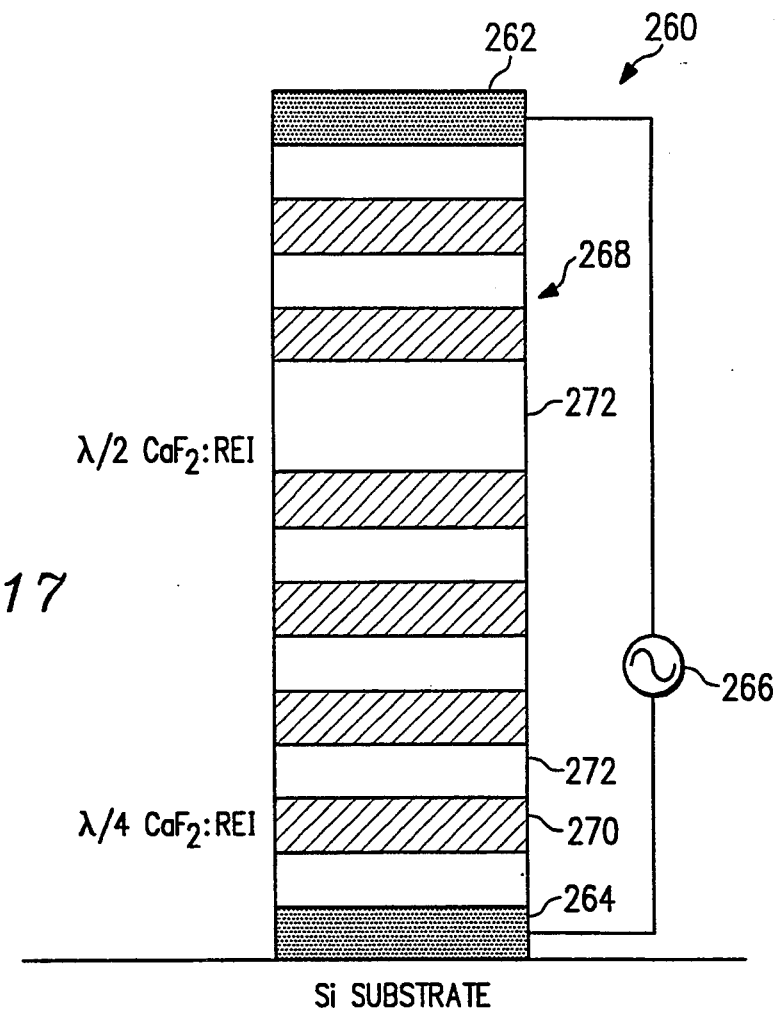
FIGS. 17 and 18 illustrate conceptually two embodiments of an electrically-pumped quarter-wavelength shifted DFB laser using RE-doped $CaF_2$ as the gain medium.
Figure 18:
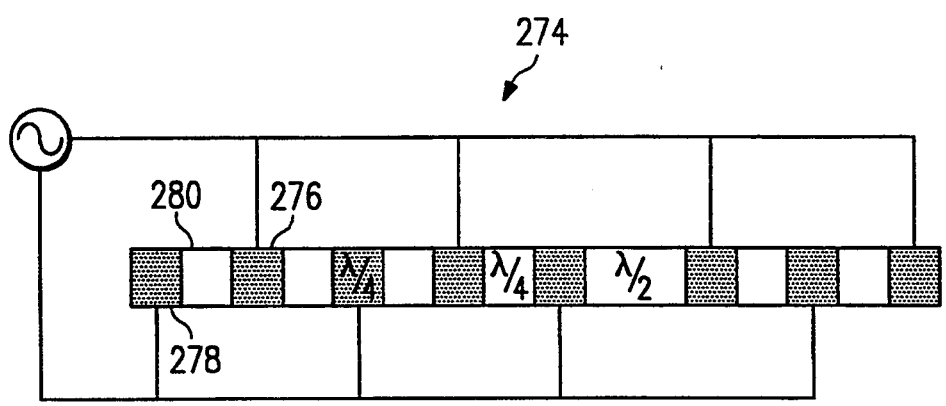

FIGS. 14 and 15 show two other structures that are similar to FIGS. 14 and 15, except that the porous Si is grown between CaF$_2$:Nd and Si substrate. FIG. 14 shows yet a further embodiment 244 with porous Si between the CaF$_2$:Nd gain medium and the substrate. In particular, transparent electrode 228 attaches to first Bragg reflector set 232 which covers CaF$_2$:Nd layer 234. CaF$_2$:Nd 234 attaches to Bragg reflector set 236. In the embodiment of FIG. 14, the porous Si layer 230 is positioned between second Bragg reflector set 236 and metal electrode 238. Metal electrode 238 attaches between porous Si layer 230 and substrate 240.

FIG. 15 also shows an embodiment 246 such that porous Si layer 230 is positioned between the CaF$_2$:Nd gain medium having CaF$_2$:Nd layer 234 and substrate 240. Particularly, Bragg reflector set 232 forms over CaF$_2$:Nd layer 234 cover a portion of Bragg reflector sets 236. Under Bragg reflector set 236 is metal electrode 238 that attaches to porous Si layer 230. A second metal electrode 248 separates porous Si layer 230 from substrate 240. In comparison with the structures in FIGS. 12 and 13, the structures in FIGS. 14 and 15 make it difficult to grow single crystal materials on the top of the porous Si. However, these structures are more attractive for a surface emitting laser, because the porous Si is not located in the path of laser output. This increases the output efficiency of the laser device. Since the photoluminescence intensity from single crystal CaF$_2$:Nd is comparable to that from polycrystalline, it may not be necessary to obtain single crystal layers on the top of the porous Si for lasing.

Several approaches can be used to increase the electroluminescence efficiency: (1) Semi-insulating CaF$_2$ films can be grown by sputtering; (2) Superlattice structures made of CaF$_2$:Nd and other semiconductors layers can be used so that carriers will accelerate effectively in the semiconductor layers and gain enough energy to induce Nd excitation in the CaF$_2$:Nd layers; and (3) Nd and another dopant such as Eu can be added together into CaF$_2$. Since CaF$_2$:Eu emits light at 420 nm by electroluminescence, the Nd can be pumped by the photons emitted from the electroluminescence of Eu or even excited by direct energy transfer from adjacent Eu atoms.

The following paragraphs discuss methods of the preferred embodiment to improve efficiency of electroluminescence. Note, also, that these methods can be used in a laser pumped by electroluminescence. The superlattice structure is similar to the cavity structure of a microcavity laser. When the length of a laser cavity is of the same order as the emitted wavelength, the laser characteristics can be significantly changed. In the microcavity domain, analysis and experiments suggest that optical gain significantly increases as the emission linewidth decreases, particularly when mirror reflectivity is high. Given the very narrow linewidth from submicron thick CaF$_2$:Nd described above and the fact that high reflectivity mirrors made of CaF$_2$/ZnSe have been demonstrated, a microcavity CaF$_2$:Nd laser pumped by electroluminescence may be achieved by improving the electroluminescence efficiency with the following methods.

The first of the above methods for improving the efficiency of electroluminescence is through the use of sputtered CaF$_2$. While the resistivity of a CaF$_2$ film grown by evaporation is around $10^{16}$ ohm-cm, a CaF$_2$ film with resistivity as low as $3 \times 10^3$ ohm-cm can be obtained by sputtering. The reduced resistivity is usually undesirable, because, in most cases, CaF$_2$ has use as a good insulator that can be grown epitaxially on silicon or GaAs. However, good conduction properties are needed if the film is used for electroluminescence applications. Since a larger number of carriers can be driven through semi-conductive relative to insulating films, the collision cross-section between the carriers and luminescence centers in CaF$_2$:Nd will be larger in the semiconductive sputtered films. This results in increased luminescence intensity. Annealing CaF$_2$:Mn in Cd vapor also increases the conductivity of the CaF$_2$ films. One possible disadvantage of the sputtered CaF$_2$ is enhanced emission quenching because of degraded crystalline quality. However, this may not be a serious problem, because, as shown for MBE-grown CaF$_2$:Nd, the photoluminescence intensity of a polycrystalline CaF$_2$:Nd film is the same as that of a single crystal CaF$_2$:Nd. This indicates that crystalline quality may not be critical.

The second above-stated method for greater electroluminescence efficiency is the formation of CaF$_2$:Nd semiconductor superlattices. Superlattice structures made of CaF$_2$:Nd and other semiconductors layers can be used so that carriers will accelerate effectively in the semiconductor layers and, thus, gain enough energy to induce Nd excitation in the CaF$_2$:Nd layers. This successfully improves the emission efficiency of a Y$_2$O$_3$:Eu thin-film electroluminescence devices. Furthermore, when the thickness of each superlattice layers is less than the wavelength of the emission, constructive interference can be produced to enhance the luminescence.

FIG. 16 shows a superlattice structure that can be used to obtain effective electroluminescence from a CaF$_2$:Nd/ZnS multilayer structure. The CaF$_2$:Nd semiconductor superlattice structure 250 of FIG. 16 includes transparent electrode 252 over CaF$_2$:Nd/semiconductor superlattice 254. CaF$_2$:Nd/semiconductor superlattice 254 includes CaF$_2$:Nd layers such as layer 256 interspersed with semiconductor layers using, for example, ZnS to achieve the desired degree of electroluminscence. CaF$_2$:Nd/semiconductor superlattice 254 is formed over metal electrode 238 which forms over substrate 240.

Transparent conductors can be made of conductive oxides, such as indium tin oxide (ITO) or aluminum-doped zinc oxide, or heavily doped semiconductors such as ZnSe or ZnS. These materials offer good electrical conductivity and optical transparency at the emissions wavelength. Since the transparent conductors also act as mirrors to provide optical feedback, the refractive index should be as different as possible from that of CaF$_2$:Nd (or other RE-doped CaF$_2$) so that strong microcavity effects can be achieved. The refractive index of ITO ranges form 1.75 to 2.3. The refractive indices of zinc oxide, ZnS, and ZnSe are around 1.86, 2.37, and 2.89, respectively, at 1-$\mu$m wavelength. Since the refractive index of RE-doped CaF$_2$ is about 1.43, these materials should be able to form high-quality DBR, or the periodic gain structure in DFB lasers, with the RE-doped CaF$_2$ to enhance the cavity effects.

Yet another method to improve electroluminescence efficiency as though the formation of Co-doped CaF$_2$. Nd and another dopant, such as Eu or Er, can be added together into CaF$_2$. CaF$_2$:Eu has been shown to emit light at 420 nm by electroluminescence. When Eu and Er are co-doped with Nd in CaF$_2$, absorption at 398 nm and 449 nm for Eu and Er, respectively, has been observed. These results suggest that, by growing a CaF$_2$:Nd/Eu or a CaF$_2$:Nd/Er film, the Nd can be pumped by the photons emitted from the electroluminescence of Eu or Er, or even excited by direct energy transfer from adjacent Eu atoms to obtain enhanced luminescence.

Based on knowledge of the materials and features of a laser cavity, additional laser structures that are likely to achieve lasing by electroluminescence are shown in FIGS. 17, 18, 19 and 20. The vertical configuration 260 of FIG. 17 includes transparent conductor 262 and metal conductor 264 having a potential applied by independent voltage source 266 to activate laser 268. Laser 268 includes interspersed layers of quarter-wavelength semiconductor 270 and quarter-wavelength CaF$_2$:RE layers 272 to serve as the gain medium. Similarly, horizontal configuration 274 of FIG. 18 includes numerous transparent conductors such as transparent conductors 276 and 278 with CaF$_2$:RE gain medium in 280 interspersed therebetween.

Figure 19:
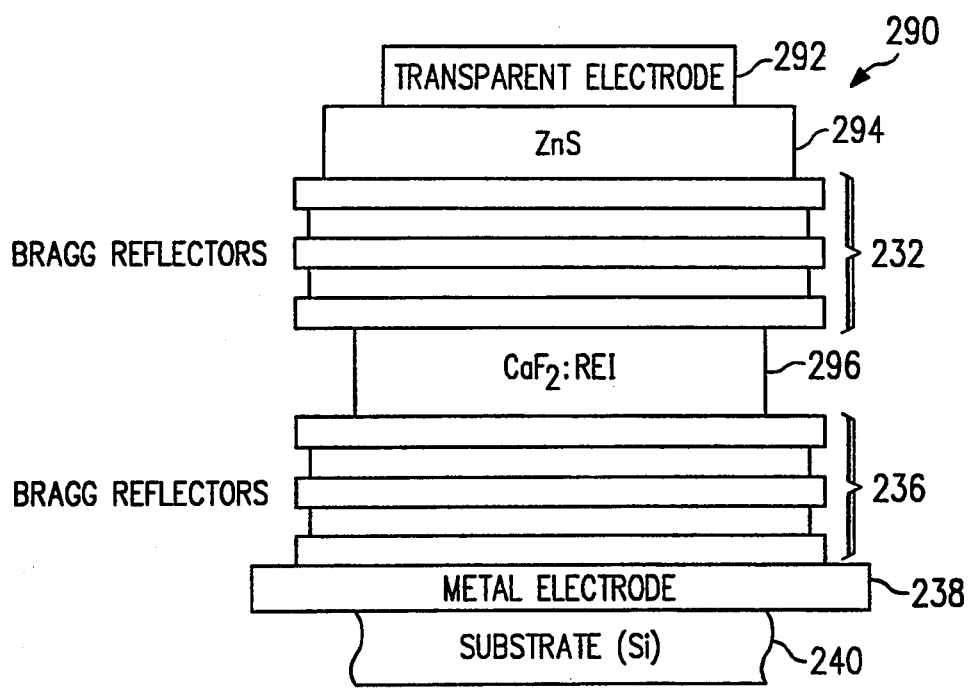
FIGS. 19 and 20 illustrate two structures that use electroluminescent ZnS as a light emitting source and $CaF_2$:RE as a gain medium.
Figure 20:
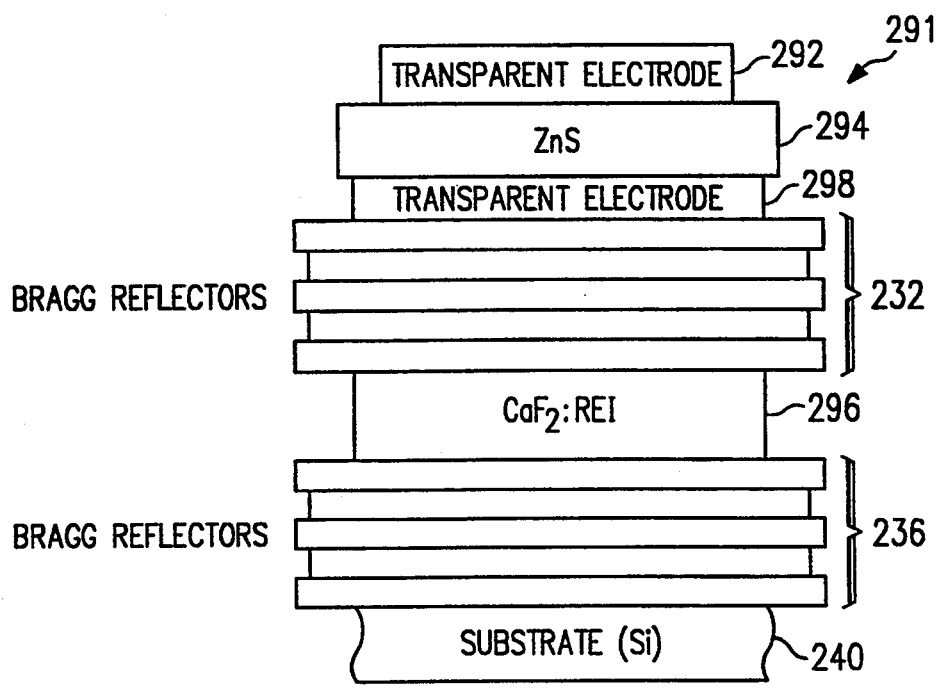

FIGS. 19 and 20 illustrate two configurations that use electroluminescent ZnS as a light emitting source as configurations 290 and 291. Configuration 290 of FIG. 19 includes transparent electrode 292 formed over ZnS layer 294. ZnS layer 294 serves as the electroluminescent light source for Bragg reflector set 232, CaF$_2$:RE layer 296 and second Bragg reflector set 236. Second Bragg reflector set 236 forms over metal electrode 238 which attaches to substrate 240. Configuration 291 of FIG. 20 includes transparent electrode 292 which is formed over ZnS layer 294. ZnS layer 294 forms over a second transparent electrode 298 which connects to Bragg reflector set 232. Between Bragg reflector set 232 and Bragg reflector set 236 is CaF$_2$:RE layer 296. Second Bragg reflector set 236 attaches directly to substrate 240 in the configuration of FIG. 23.

Extensive research has been conducted recently to achieve light emission from group IV materials. Light emission from porous Si, isoelectronically doped silicon, and strained GeSi alloys have been reported. Considering that these materials are compatible with silicon-based technologies and that a very low lasing threshold may be achieved from the RE-doped CaF$_2$ microcavity laser, the preferred embodiment of the proposed microcavity laser readily accommodates these materials within the scope of the invention.

The availability of silicon-based OEICs and photonic integrated circuits (PICs) has a wide range of military and commercial uses. One application of silicon-based OEICs or PICs is in the area of multichip module interconnectivity. As the complexity of multichip modules increases, interconnect resistivity and parasitic capacitance created by high-density metal lines pose major obstacles to system performance. Optical interconnectivity has long been considered a solution to these interconnectivity problems. Silicon-based OEICs and PICs, for example, have specific application for optically coupling phased-array radar elements. Whereas significant progress has been made in the area of GaAs and other III-V-based monolithic microwave integrated circuits (MMICs) for radar elements, work on digital logic and memory circuitry based on III-V materials has not been as fruitful. Hence, optical sources and modulators monolithically integrated with silicon digital circuitry may provide a mechanism for optical cooling state-of-the-art silicon digital and logic circuitry to GaAs MMIC elements.

Current work in the area of optical computing is largely limited to III-V and LiNbO$_3$ materials systems. With the exception of a silicon-based laser source, all other functions required for optical computing (modulators, detectors, and waveguides) have been demonstrated. In fact, large-scale integration (LSI) silicon detectors (e.g., CCDs) are commercially available, and medium-scale integration (MSI) modulators on silicon (e.g., DMDs) have been demonstrated and are beginning to be commercially produced. Whereas DMDs are free-space modulators, materials such as BaTiO$_3$ and (Pb,La)(Zr, Ti)O$_3$ (which have excellent electro-optic properties) are used for high dielectric capacitors in post-ULSI silicon memory applications that may be employed with the various configurations of the preferred embodiment. SiO$_2$ waveguides on silicon have also been demonstrated.

Silicon-based OEICs and PICs formed according to the concepts of the preferred embodiment are particularly attractive, because existing high-volume silicon processes enjoy an economy of scale unparalleled by other electronic or optoelectronic materials technologies. Possible applications of silicon-based OEICs formed by the present invention are silicon-based emitters for displays, fiber to the home and other cable networks, computer communication systems for automotive electronics, and low-cost disposable OEICs for medical and in vivo uses. Finally, silicon-based OEICs according to present invention may provide new functionality such as circuit-level image processing devices or smart pixels.

In summary, concepts within the scope of the present invention include (1) preparation of thin CaF$_2$:RE films; (2) fabricating optically pumped silicon-based CaF$_2$:Nd microcavity lasers including the growth of CaF$_2$ with other RE dopants, (3) growing and fabricating electroluminescent sources appropriate for pumping CaF$_2$:RE microcavities, and (4) achieving laser action by either electroluminescent or direct electrical pumping.

Although the present invention and its advantages have been described in detail, it should be understood that various changes, substitutions and alterations can be made herein without departing from the spirit and scope of the invention as defined by the appended claims.

What is claimed is:

1. A silicon-based microlaser formed of doped thin material films, comprising:
   a semiconductor substrate material comprising silicon;
   at least one layer of CaF$_2$ grown on said semiconductor substrate material comprising a predetermined amount of dopant sufficient to cause spectral emissions on said layer when pumped; said spectral emissions having a high intensity an narrow emission linewidths;
   said layer further having a thickness within an order of magnitude of the wavelength of said spectral emission such that intensities of said spectral emissions are insensitive to crystal quality of the layer.

2. The apparatus of claim 1, wherein said dopant comprises a transition metal.

3. The apparatus of claim 1, wherein said dopant comprises a rare-earth element.

4. The apparatus of claim 3, wherein said rare-earth element comprises Nd.

5. The apparatus of claim 3, wherein said rare-earth element comprises Eu.

6. The apparatus of claim 1, wherein said dopant comprises a combination of Nd and Eu.

7. The apparatus of claim 1, wherein said dopant comprises a combination of Nd and Er.

8. The apparatus of claim 1, wherein said layer is optically pumped.

9. The apparatus of claim 1, wherein said layer is electrically pumped.

10. The apparatus of claim 1, further comprising a distributed Bragg reflector set for reflecting said spectral emission.

11. The apparatus of claim 1, further comprising a distributed feedback laser for reflecting and amplifying said spectral emission.

12. The apparatus of claim 1 wherein said film quality of epitaxial.

13. The apparatus of claim 12, wherein said dopant comprises a rare-earth element.

14. The apparatus of claim 13, wherein said dopant comprises Nd.

15. The apparatus of claim 1 wherein said film quality is polycrystalline.

16. A method for producing a spectral emission comprising the steps of:
   forming a thin film layer of $CaF_2$ over a semiconductor substrate material comprising silicon, said thin film layer comprising a predetermined amount of dopant; and
   pumping said thin film layer to produce a spectral emission having a narrow linewidth wherein said thin film layer has a thickness within an order of magnitude of the wavelength of said spectral emission, and wherein the intensity of said spectral emission is generally insensitive to whether said thin film layer is epitaxial or polycrystalline.

17. The method of claim 16, wherein said step of pumping said thin film layer comprises pumping a thin film layer having a dopant comprising a transition metal.

18. The method of claim 16, wherein said step of pumping said thin film layer comprises pumping a thin film layer having a dopant comprising a rare-earth element.

19. The method of claim 18, wherein said step of pumping said thin film layer comprises pumping a thin film layer having a dopant comprising Nd.

20. The method of claim 18, wherein said step of pumping said thin film layer comprises pumping a thin film layer comprising a dopant of Eu.

21. The method of claim 18, wherein said step of pumping said thin film layer comprises pumping a thin film layer comprising a dopant of Er.

22. The method of claim 16, wherein said step of pumping said thin film layer comprises pumping a thin film layer having a dopant comprising a combination of Nd and Eu.

23. The method of claim 16, wherein said step of pumping said thin film layer comprises pumping a thin film layer having a dopant comprising a combination of Nd and Er.

24. The method of claim 16, wherein said step of pumping said thin film layer comprises optically pumping said thin film layer.

25. The method of claim 16, wherein said step of pumping said thin film layer comprises electrically pumping said thin film layer.

26. The method of claim 16, further comprising the step of forming a distributed Bragg reflector adjacent said thin film layer for reflecting said spectral emission.

* * * * *